United States Patent
Burney (10) Patent No.: US 7,639,054 B1
(45) Date of Patent: Dec. 29, 2009

(54) TECHNIQUES FOR GENERATING PROGRAMMABLE DELAYS

(75) Inventor: Ali Burney, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/015,223

(22) Filed: Jan. 16, 2008

(51) Int. Cl.
*H03L 7/00* (2006.01)

(52) U.S. Cl. .................. 327/161; 327/262; 327/270; 327/271

(58) Field of Classification Search ............... 327/149, 327/152, 158, 262, 269, 270, 271, 161
See application file for complete search history.

(56) References Cited

U.S. PATENT DOCUMENTS

| | | | |
|---|---|---|---|
| 4,795,985 A * | 1/1989 | Gailbreath, Jr. ............ | 327/158 |
| 5,118,975 A * | 6/1992 | Hillis et al. ................ | 327/158 |
| 5,317,601 A * | 5/1994 | Riordan et al. ............. | 375/356 |
| 5,389,843 A * | 2/1995 | McKinney ................. | 327/276 |
| 5,446,766 A * | 8/1995 | Wray ......................... | 375/373 |
| 5,790,612 A * | 8/1998 | Chengson et al. ........... | 375/373 |
| 5,867,453 A * | 2/1999 | Wang et al. ................ | 368/120 |
| 6,092,030 A * | 7/2000 | Lepejian et al. ............ | 702/79 |
| 6,100,735 A * | 8/2000 | Lu ............................ | 327/158 |
| 6,194,928 B1* | 2/2001 | Heyne ....................... | 327/152 |
| 6,294,938 B1* | 9/2001 | Coddington et al. ....... | 327/158 |
| 6,621,314 B2* | 9/2003 | Krishnamurty ............ | 327/158 |
| 6,847,241 B1* | 1/2005 | Nguyen et al. ............. | 327/158 |
| 7,026,850 B2* | 4/2006 | Atyunin et al. ............ | 327/158 |
| 7,042,296 B2 | 5/2006 | Hui et al. | |
| 7,208,991 B2 | 4/2007 | Carley et al. | |

\* cited by examiner

*Primary Examiner*—Lincoln Donovan
*Assistant Examiner*—William Hernandez
(74) *Attorney, Agent, or Firm*—Steven J. Cahill (57) ABSTRACT

A circuit includes a sensing circuit, a control circuit, and a programmable delay circuit. The sensing circuit generates delay compensation signals that change in response to variations in at least one of a process and a temperature of the circuit. The control circuit generates dynamic control signals in response to the delay compensation signals. The programmable delay circuit is configurable to delay a signal transmitted through an external terminal of the circuit by a delay that is selected by the dynamic control signals.

23 Claims, 8 Drawing Sheets

TECHNIQUES FOR GENERATING PROGRAMMABLE DELAYS

BACKGROUND OF THE INVENTION

The present invention relates to electronic circuits, and more particularly, to techniques for generating programmable delays.

A delay-locked loop is circuit that generates an output clock signal in response to an input reference clock signal. A typical delay-locked loop circuit includes a phase detector that compares a phase of the input reference clock signal with the phase of a feedback signal generated from a delay chain.

BRIEF SUMMARY OF THE INVENTION

According to some embodiments of the present invention, a circuit includes a sensing circuit, a control circuit, and a programmable delay circuit. The sensing circuit generates delay compensation signals that change in response to variations in at least one of a process and a temperature of the circuit. The control circuit generates dynamic control signals in response to the delay compensation signals. The programmable delay circuit is configurable to delay a signal transmitted through an external terminal of the circuit by a delay that is selected by the dynamic control signals.

According to other embodiments, a circuit includes a control circuit and two programmable delay circuits. The control circuit generates dynamic control signals. The first programmable delay circuit is configurable to delay a signal transmitted through a first pin of the circuit by a delay that is selected by the dynamic control signals. The second programmable delay circuit is configurable to delay a signal transmitted through a second pin of the circuit by a delay that is selected by the dynamic control signals. The first and the second programmable delay circuits are configurable to be cascaded together such that the second programmable delay circuit delays a signal delayed by the first programmable delay circuit.

Various objects, features, and advantages of the present invention will become apparent upon consideration of the following detailed description and the accompanying drawings, in which like reference designations represent like features throughout the figures.

DETAILED DESCRIPTION OF THE INVENTION

In many integrated circuits and digital systems, a variety of factors can cause two signals to lose a desired phase relationship. For example, if two signals are transmitted through wires that have different lengths in an integrated circuit or on a printed circuit board, the phase relationship between the two signals may not remain the same. Process, supply voltage, and temperature (PVT) variations between similarly fabricated integrated circuits or within a single integrated circuit can also cause the phase relationship of two signals to vary outside a tolerable range. Although process variations can be measured after manufacture of an integrated circuit, the temperature of an integrated circuit can vary significantly during its operation.

An integrated circuit, such as a field programmable gate array (FPGA), can receive multiple data bit signals in parallel from an external source, such as an external memory chip. A phase error between corresponding parallel data bit signals may cause errors in reading the data if the phase error exceeds a tolerable range.

According to some embodiments of the present invention, delay circuits are provided on an integrated circuit that can be programmed to compensate for phase errors and differential delays between signals transmitted through pins of the integrated circuit. In some embodiments, the delays of the delay circuits can be programmed to compensate for variations in the process, supply voltage, and temperature of an integrated circuit. In other embodiments, the delay circuits can be cascaded together to provide larger delays for lower frequency signals.

Figure 1:
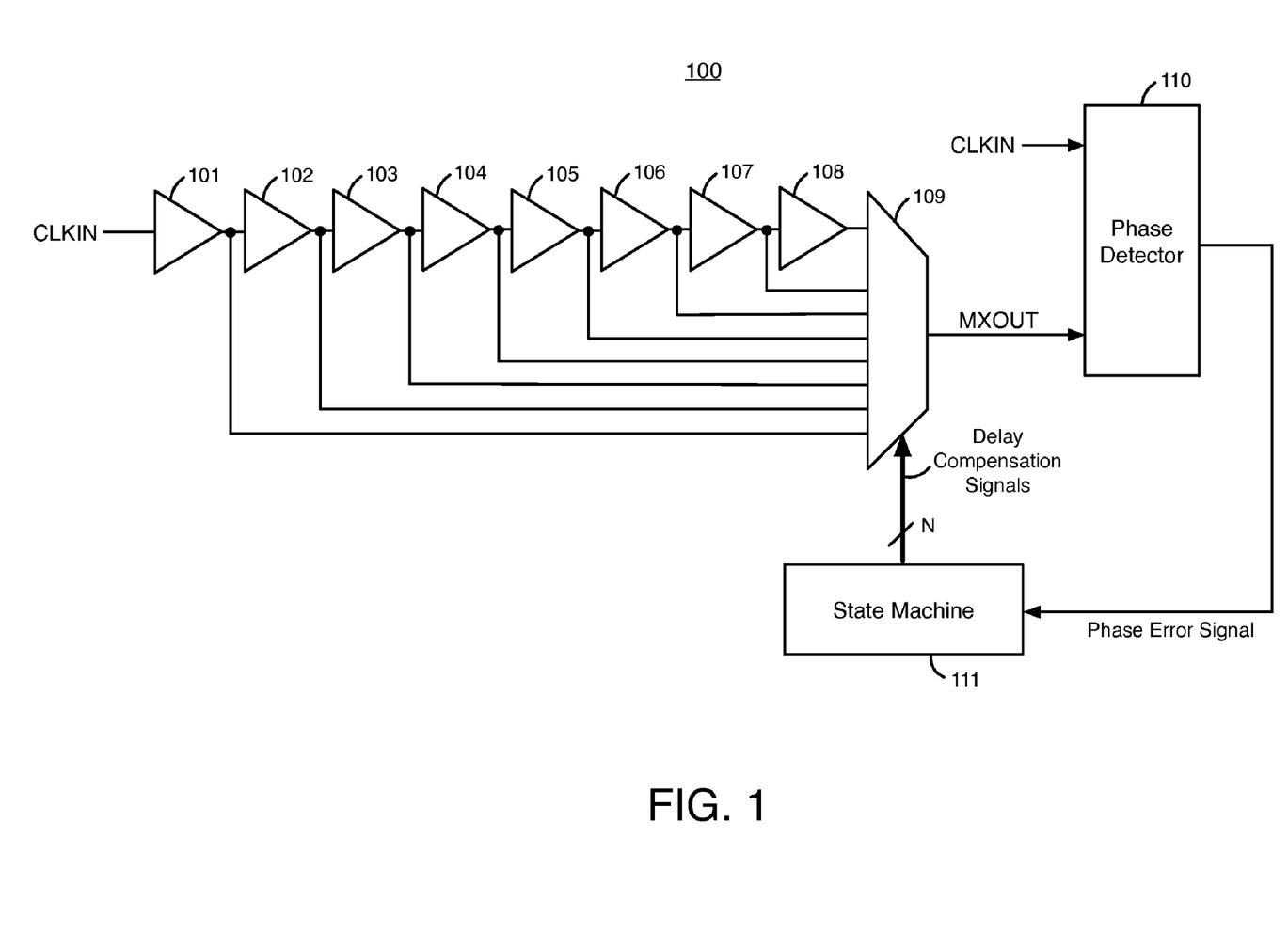
FIG. 1 illustrates a delay-locked loop circuit, according to an embodiment of the present invention.

FIG. 1 illustrates a delay-locked loop circuit 100, according to an embodiment of the present invention. Delay-locked loop (DLL) 100 is a feedback loop circuit that includes delay circuits 101-108, 8-to-1 multiplexer 109, phase detector 110, and state machine 111. Delay circuits 101-108 can be any type of delay circuit. For example, each of the delay circuits 101-108 can include one, two, or more inverters. Typically, each of the delay circuits 101-108 in DLL 100 has the same architecture. Although 8 delay circuits 101-108 are shown in FIG. 1, DLL 100 can have any number of delay circuits (e.g., 10, 12, 16, 24, etc.).

A periodic input clock signal CLKIN is transmitted to the input terminal of delay circuit 101. CLKIN can have any suitable frequency (e.g., 100 MHz). Delay circuits 101-108 are coupled together in series as shown in FIG. 1. Clock signal CLKIN is transmitted through each of the delay circuits 101-108. Each delay circuit 101-108 delays CLKIN by the same amount of time T. The phase of CLKIN is delayed by time T at the output terminal of delay circuit 101, by time 2T at the output terminal of delay circuit 102, by time 3T at the output terminal delay circuit 103, by time 4T at the output terminal of delay circuit 104, etc.

The output terminal of each of delay circuits 101-108 is coupled to one of the 8 input terminals of multiplexer 109. Multiplexer 109 selects the output signal of one of delay circuits 101-108 in response to the logic states of delay compensation signals generated by state machine 111. Multiplexer 109 transmits the selected delay circuit output signal to its output terminal as the output clock signal MXOUT of multiplexer 109.

The output clock signal MXOUT of multiplexer 109 is transmitted to a first input terminal of phase detector 110. Phase detector 110 receives the input clock signal CLKIN at its second input terminal. Phase detector 110 compares the phase of the CLKIN signal to the phase of the output clock signal MXOUT of multiplexer 109. Phase detector 110 generates an output phase error signal having a pulse width that varies based on the difference between the phases of CLKIN and the output clock signal MXOUT of multiplexer 109.

State machine 111 receives the phase error signal from phase detector 110 at an input terminal. State machine 111 generates an N number of delay compensation signals (e.g., 3 signals) based on the pulse width of the phase error signal. The delay compensation signals are transmitted to select input terminals of multiplexer 109. Circuit elements 101-111 are typically implemented in hard-wired logic circuitry.

When the phase error signal indicates that the phase of CLKIN is not aligned with the phase of MXOUT, state machine 111 adjusts the logic states of the delay compensation signals until the phases of CLKIN and MXOUT are aligned. Multiplexer 109 selects a different output signal of the delay circuits 101-108 to be MXOUT in response to a change in the logic states of the delay compensation signals. When phase error signal indicates that the phase of CLKIN is aligned with the phase of MXOUT, state machine 111 maintains the logic states of the delay compensation signals constant. Multiplexer 109 transmits the output signal of the same delay circuit to its output terminal as MXOUT, while the delay compensation signals are constant.

The process and the temperature of the integrated circuit containing DLL 100 affect the delay that delay circuits 101-108 provide to the CLKIN signal. The supply voltage provided to delay circuits 101-108 may also affect the delay that the delay circuits provide to CLKIN. Process, supply voltage, and temperature (PVT) variations of the integrated circuit can cause the delay that delay circuits 101-108 provide to CLKIN to increase or to decrease.

Variations in the delay that delay circuits 101-108 provide to CLKIN affect the phase of MXOUT, which in turn affects the phase error signal generated by phase detector 110 and the delay compensation signals generated by state machine 111. State machine 111 adjusts the logic states of the delay compensation signals in response to changes in the phase error signal that are caused, e.g., by variations in the process, supply voltage, and temperature of the integrated circuit in order to align the phases of CLKIN and MXOUT. When the phases of CLKIN and MXOUT are aligned, the logic states of the delay compensation signals generated by state machine 111 indicate the delays of delay circuits 101-108, and as a result, the extent to which process, supply voltage, and temperature variations on the integrated circuit have affected the delays of delay circuits 101-108.

DLL 100 is used to determine variations in the delays generated by delay circuits 101-108 that are caused by PVT variations. For example, the delay compensation signals may cause multiplexer 109 to select the output signal of delay circuit 106 in an integrated circuit having a faster process, and the delay compensation signals may cause multiplexer 109 to select the output signal of delay circuit 102 in an integrated circuit having a slower process. As another example, the delay compensation signals may cause multiplexer 109 to select the output signal of delay circuit 103 when the integrated circuit is at a higher temperature, and the delay compensation signals may cause multiplexer 109 to select the output signal of delay circuit 107 when the integrated circuit is at a lower temperature.

The logic states of the delay compensation signals generated by state machine 111 indicate the amount of process, supply voltage, and temperature variations on an integrated circuit. However, noise and other high frequency changes in the supply voltage provided to delay circuits 101-108 typically do not affect the logic states of the delay compensation signals. Typically, only low frequency or persistent changes in the supply voltage affect the logic states of the delay compensation signals. According to some embodiments of the present invention, the delay compensation signals are used to select the delays of programmable delay circuits, so that the programmable delay circuits generate desired delays over a range of process, supply voltage, and temperature variations of an integrated circuit.

Figure 2A:
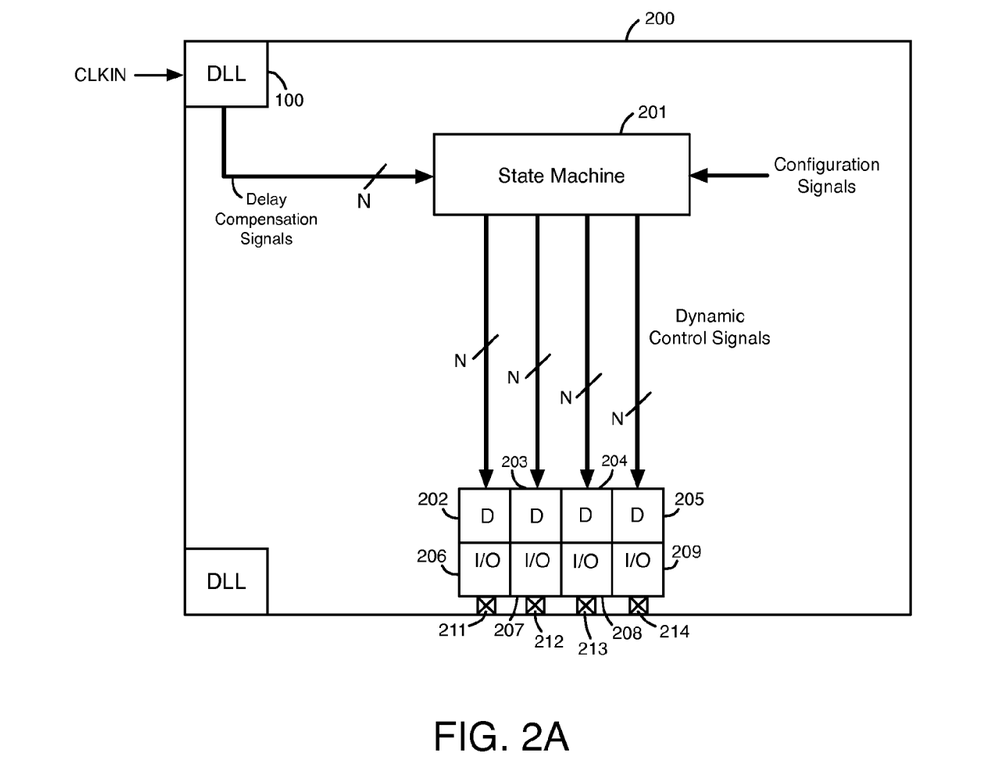
FIG. 2A illustrates a portion of an integrated circuit having programmable delay circuits that delay input and output signals, according to an embodiment of the present invention.

FIG. 2A illustrates a portion of an integrated circuit 200 having programmable delay circuits that delay input and output signals, according to an embodiment of the present invention. Integrated circuit 200 can be, for example, an application specific integrated circuit (ASIC) or a programmable logic integrated circuit. Programmable logic integrated circuits include, e.g., field programmable gate arrays (FPGAs) and programmable logic devices (PLDs).

Integrated circuit 200 includes DLL 100, state machine 201, programmable delay circuits 202-205, input/output (I/O) blocks 206-209, and input/output (I/O) pins 211-214. I/O pins 211-214 are external terminals of integrated circuit 200. An example of the architecture of DLL 100 on integrated circuit 200 is shown in FIG. 1.

Figure 2B:
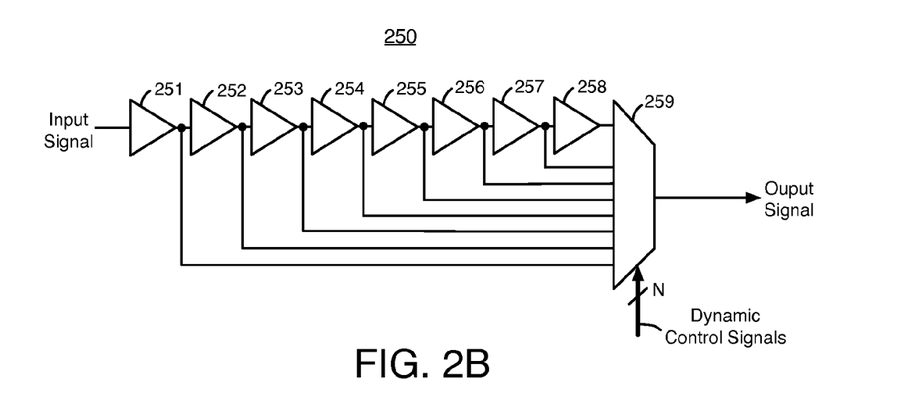
FIG. 2B illustrates an example of a programmable delay circuit, according to an embodiment of the present invention.

FIG. 2B illustrates an example of a programmable delay circuit, according to an embodiment of the present invention. Programmable delay circuit 250 shown in FIG. 2B is an example of each of the programmable delay circuits 202-205 shown in FIG. 2A. Programmable delay circuit 250 includes delay circuits 251-258 and 8-to-1 multiplexer 259.

Programmable delay circuit 250 includes the same number of delay circuits as DLL 100. In the examples of FIGS. 1 and 2B, DLL 100 includes 8 delay circuits 101-108 coupled together in series, and programmable delay circuit 250 includes 8 delay circuits 251-258 coupled together in series. Each of delay circuits 251-258 has the same architecture as each of the other delay circuits 251-258 and as each of delay circuits 101-108. For example, if each of delay circuits 101-108 has two inverters coupled in series, then each of delay circuits 251-258 has two inverters coupled in series. Each of delay circuits 251-258 has the same delay. Circuit elements 251-259 are typically implemented in hard-wired logic circuitry.

DLL 100 in integrated circuit 200 generates an N number of delay compensation signals as described above with respect to FIG. 1. The delay compensation signals are transmitted to a state machine 201. State machines 111 and 201 are typically different state machines, although in some embodiments, one state machine can perform the functions of state machines 111 and 201. State machine 201 can, for example, be implemented using programmable logic blocks (e.g., logic elements) that are configured by configuration data stored in a programmable logic integrated circuit. According to alternative embodiments, state machine 111, 201, or any of the other state machines described herein can be replaced with another type of control circuit that performs the functions of the state machine.

Configuration signals are also transmitted to state machine 201. The configuration signals can be generated, for example, from configuration data stored on a programmable logic integrated circuit. The logic states of the configuration signals indicate a desired delay for each of programmable delay circuits 202-205.

State machine 201 generates 4 sets of dynamic control signals based on the logic states of the delay compensation signals and the logic states of the configuration signals. Specifically, state machine 201 calculates the logic states for the dynamic control signals that cause programmable delay circuits 202-205 to have the desired delays indicated by the configuration signals. As mentioned above, the delays of delay circuits on integrated circuit 200, including delay circuits 251-258, change in response to factors such as process, supply voltage, and temperature variations. As a result, maintaining the dynamic control signals at constant logic states may not achieve the desired delays for the programmable delay circuits 202-205 across a range of process, supply voltage, and temperature variations. Therefore, state machine 201 adjusts the logic states of the dynamic control signals in response to the delay compensation signals to compensate for process, supply voltage, and temperature variations, so that the delays of programmable delay circuits 202-205 more closely match the desired delays indicated by the configuration signals.

For example, if the frequency of the input clock signal CLKIN is 100 MHz, the period of CLKIN is 10 nanoseconds (ns). If the actual delay of each of delay circuits 101-108 is 2.5 ns, state machine 111 generates logic states for the delay compensation signals that cause multiplexer 109 to select the output signal of delay circuit 104 so that the phases of CLKIN and MXOUT are aligned. If the configuration signals indicate that the desired delay for programmable delay circuit 202 is one-half of a period of CLKIN, state machine 201 generates logic states for the first set of dynamic control signals that cause multiplexer 259 to select the output signal of delay circuit 252 to achieve a delay of 5 ns for programmable delay circuit 202 in response to logic states of the delay compensation signals indicating each delay circuit 101-108 has a delay of 2.5 ns.

State machine 201 generates four sets of dynamic control signals. Each set of the dynamic control signals has an N number of signals that are transmitted to the select input terminals of multiplexer 259 in one of the programmable delay circuits 202-205. The logic states of the dynamic control signals determine the delay of each of the programmable delay circuits 202-205.

State machine 201 can, for example, generate different delays for each of the programmable delay circuits 202-205 on a per pin basis in response to the configuration signals. For example, state machine 201 can generate a first set of dynamic control signals that cause multiplexer 259 in programmable delay circuit 202 to transmit the output signal of delay circuit 253 to its output terminal. At the same time, state machine 201 can generate a second set of dynamic control signals that cause multiplexer 259 in programmable delay circuit 204 to transmit the output signal of delay circuit 257 to its output terminal. The configuration signals can be selected to generate the same delays for one or more of programmable delay circuits 202-205, or different delays for each of programmable delay circuits 202-205.

I/O blocks 206-209 on integrated circuit 200 are coupled to I/O pins 211-214, respectively. Each I/O block 206-209 can include an input buffer having an input terminal coupled to the respective pin 211-214 and an output buffer having an output terminal coupled to the respective pin 211-214.

Programmable delay circuit 202 is coupled to I/O block 206. Programmable delay circuit 203 is coupled to I/O block 207. Programmable delay circuit 204 is coupled to I/O block 208. Programmable delay circuit 205 is coupled to I/O block 209. According to an alternative embodiment, programmable delay circuits 202-205 are located inside I/O blocks 206-209, respectively. Each of the programmable delay circuits 202-205 can, for example, be coupled to a register in the respective I/O block 206-209. The register or the programmable delay circuit is coupled to an input buffer and/or an output buffer in the I/O block.

For example, the output signal of multiplexer 259 in programmable delay circuit 202 can be transmitted to the input terminal of an output buffer in I/O block 206 via a register, and the output signal of the output buffer is transmitted to pin 211. In this example, programmable delay circuit 202 delays output signals before they are driven outside integrated circuit 200 through pin 211 by the output buffer.

As another example, a signal applied to pin 212 is transmitted to the input terminal of an input buffer in I/O block 207, and the output signal of the input buffer in I/O block 207 can be transmitted to the input terminal of delay circuit 251 in programmable delay circuit 203 via a register. In this example, programmable delay circuit 203 delays input signals after they are driven into integrated circuit 200 through pin 212 by the input buffer in I/O block 207.

Programmable delay circuits 202-205 can provide a programmable delay for input signals driven on-chip through an input pin. Programmable delay circuits 202-205 can also provide a programmable delay for output signals driven off-chip through an output pin. State machine 201 can vary the programmable delay of any of programmable delay circuits 202-205 by changing the logic states of a corresponding set of the dynamic control signals. State machine 201 changes the logic states of the dynamic control signals in response to changes in the logic states of the delay compensation signals and/or changes in the logic states of the configuration signals.

A change in the logic states of a set of the dynamic control signals causes multiplexer 259 in one of the programmable delay circuits to transmit the output signal of a different one of the delay circuits 251-258 to its output terminal. Thus, a change in the logic states of a set of the dynamic control signals causes the delay of one of the programmable delay circuits 202-205 to change. State machine 201 can change the delay of programmable delay circuits 202-205 at any time during the operation of integrated circuit 200 in response to changes in the delay compensation signals.

Figure 3:
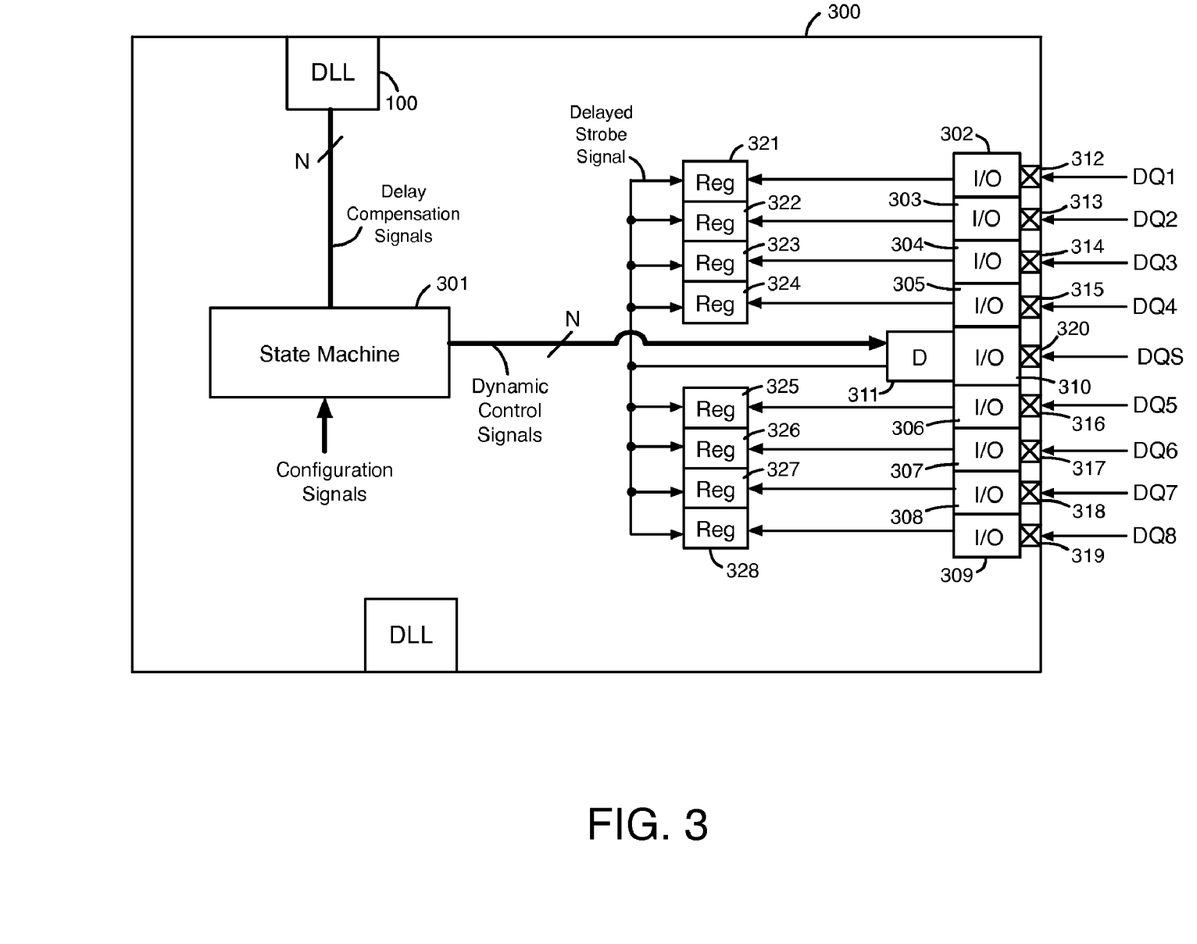
FIG. 3 illustrates a portion of an integrated circuit having a programmable delay circuit that delays an input strobe signal, according to an embodiment of the present invention.

FIG. 3 illustrates a portion of an integrated circuit 300 having a programmable delay circuit that delays an input strobe signal, according to an embodiment of the present invention. Integrated circuit 300 can be, e.g., an ASIC or a programmable logic integrated circuit. Integrated circuit 300 includes DLL 100, state machine 301, input/output (I/O) blocks 302-310, programmable delay circuit 311, input/output (I/O) pins 312-320, and registers 321-328.

I/O pins 312-320 are external terminals of integrated circuit 300. An example of the architecture of DLL 100 in integrated circuit 300 is shown in FIG. 1. An example of the architecture of programmable delay circuit 311 is shown in FIG. 2B.

DLL 100 in integrated circuit 300 generates an N number of delay compensation signals as described above with respect to FIG. 1. The delay compensation signals are transmitted to a state machine 301. Configuration signals are also transmitted to state machine 301. State machine 301 generates one set of N dynamic control signals in response to the logic states of the delay compensation signals and in response to the logic states of the configuration signals. The dynamic control signals are transmitted to programmable delay circuit 311. The dynamic control signals determine the delay of programmable delay circuit 311.

State machine 301 selects a delay for programmable delay circuit 311 based on the delay indicated by the logic states of the configuration signals. State machine 301 adjusts the logic states of the dynamic control signals in response to the logic states of the delay compensation signals to compensate for process, supply voltage, and temperature variations of integrated circuit 300, so that the delay of programmable delay circuit 311 more closely matches the desired delay indicated by the configuration signals. State machine 301 can, for example, be implemented using programmable logic blocks (e.g., logic elements) that are configured by configuration data stored in a programmable logic integrated circuit.

Eight parallel data bit signals DQ1-DQ8 are transmitted to pins 312-319 from an external source as shown in FIG. 3. Eight input buffers in the eight I/O blocks 302-309 drive the data bit signals DQ1-DQ8 from pins 312-319 to registers 321-328, respectively. Registers 321-328 store the data bit signals DQ1-DQ8 in response to a strobe signal DQS. The strobe signal DQS can be, for example, an externally generated a clock signal. Registers 321-328 are typically implemented in hard-wired logic circuitry. According to an alternative embodiment, registers 321-328 are located inside I/O blocks 302-309, respectively.

The strobe signal DQS is transmitted to pin 320 from an external source as shown in FIG. 3. An input buffer in I/O block 310 drives the strobe signal from pin 320 to programmable delay circuit 311. Programmable delay circuit 311 delays the strobe signal by the amount of delay indicated by the dynamic control signals. The amount of delay provided to the strobe signal is selected by the configuration signals and is adjusted in response to PVT variations as indicated by the delay compensation signals. The delayed strobe signal is transmitted from programmable delay circuit 311 to each of the eight registers 321-328 through, e.g., a clock tree. Registers 321-328 capture and store the data bit signals DQ1-DQ8, respectively, in response to a predefined logic state or logic transition in the strobe signal.

In order for registers 321-328 to capture the data bit signals DQ1-DQ8, the strobe signal has to be synchronized with the data bit signals DQ1-DQ8 according to a predefined phase relationship. For example, the midpoint of each pulse in the strobe signal DQS may have to occur 90 degrees after the start of periods of the data bit signals DQ1-DQ8, in order for registers 321-328 to capture the data bit signals. By removing any offset in the delay of programmable delay circuit 311 caused by PVT variations, programmable delay circuit 311 causes the phase of the strobe signal DQS to occur at the correct time so that registers 321-328 can capture the data bit signals DQ1-DQ8 with minimal or no errors.

Figure 4:
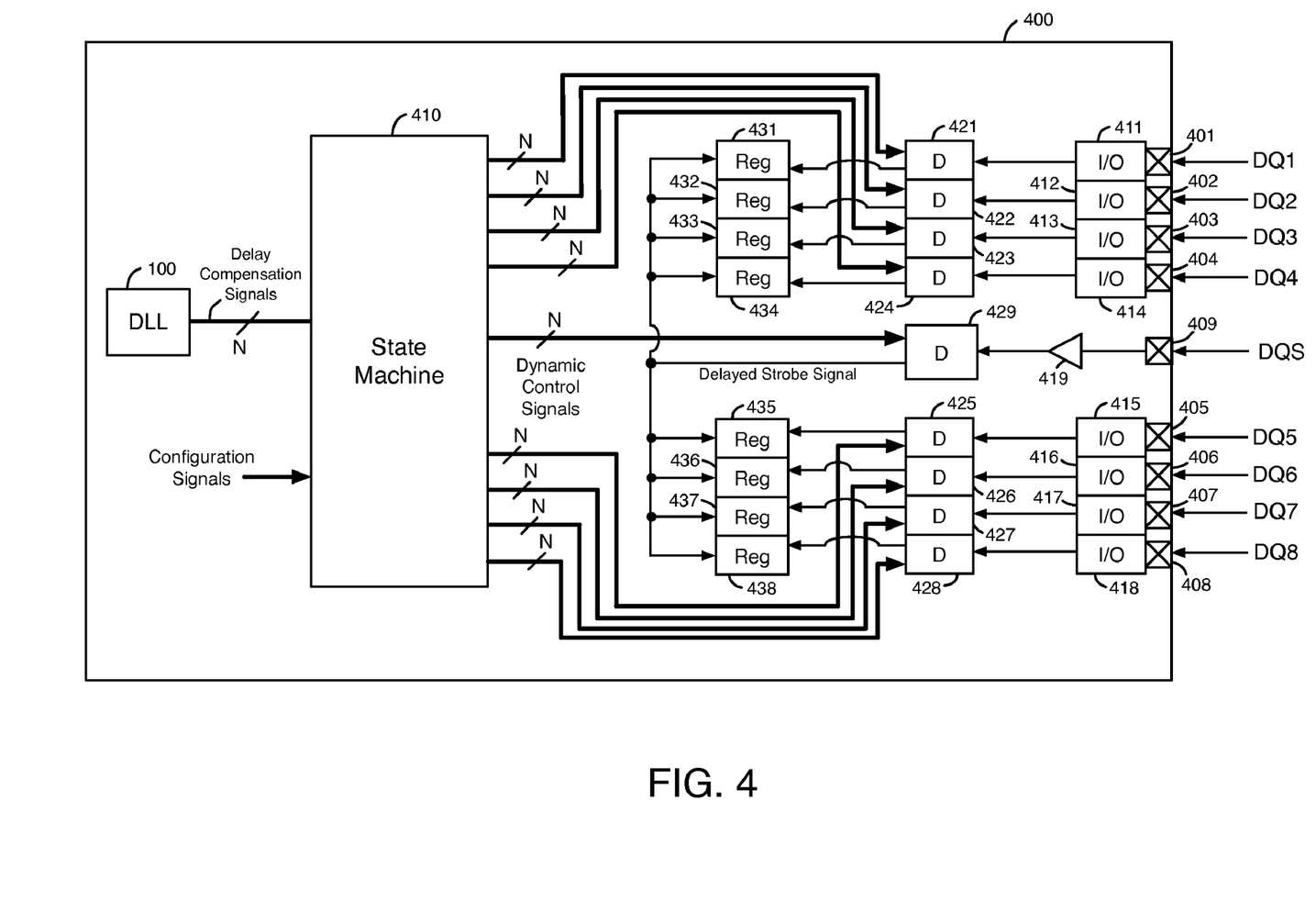
FIG. 4 illustrates a portion of an integrated circuit having programmable delay circuits that delay input data and strobe signals, according to an embodiment of the present invention.

FIG. 4 illustrates a portion of an integrated circuit 400 having programmable delay circuits that delay input data and strobe signals, according to an embodiment of the present invention. Integrated circuit 400 can be, e.g., an ASIC or a programmable logic integrated circuit. Integrated circuit 400 includes DLL 100, state machine 410, input/output (I/O) pins 401-409, input/output (I/O) blocks 411-418, input buffer 419, programmable delay circuits 421-429, and registers 431-438.

I/O pins 401-409 are external terminals of the integrated circuit 400. An example of the architecture of DLL 100 in integrated circuit 400 is shown in FIG. 1. An example of the architecture of each of programmable delay circuits 421-429 is shown in FIG. 2B.

DLL 100 in integrated circuit 400 generates an N number of delay compensation signals as described above with respect to FIG. 1. The delay compensation signals are transmitted to a state machine 410. Configuration signals are also transmitted to state machine 410. State machine 410 generates 9 sets of N dynamic control signals in response to the logic states of the delay compensation signals and in response to the logic states of the configuration signals. Each set of the 9 sets of dynamic control signals is transmitted to one of programmable delay circuits 421-429.

State machine 410 selects the delays of delay circuits 421-429 based on the desired delays indicated by the logic states of the configuration signals. State machine 410 adjusts the logic states of the dynamic control signals in response to the delay compensation signals to compensate for process, supply voltage, and temperature variations of integrated circuit 400, so that the delays of programmable delay circuits 421-429 more closely match the desired delays indicated by the configuration signals. State machine 410 can change the delays of the programmable delay circuits 421-429 at any time during the operation of integrated circuit 400 in response to changes in the delay compensation signals.

State machine 410 can, for example, generate different delays for each of the programmable delay circuits 421-429 on a per pin basis in response to the configuration signals. For example, programmable delay circuit 421 can have a different delay than programmable delay circuits 422-429, and programmable delay circuit 422 can have a different delay than programmable delay circuits 421 and 423-429. Alternatively, state machine 410 can generate the same delay for one or more of programmable delay circuits 421-429 in response to the configuration signals. State machine 410 can, for example, be implemented using programmable logic blocks (e.g., logic elements) that are configured by configuration data stored in a programmable logic integrated circuit.

Eight data bit signals DQ1-DQ8 are transmitted to pins 401-408, respectively, from an external source as shown in FIG. 4. Eight input buffers in the eight I/O blocks 411-418 drive the data bit signals DQ1-DQ8 from pins 401-408 to programmable delay circuits 421-428, respectively. Programmable delay circuits 421-428 delay the data bit signals DQ1-DQ8 by delays that are determined by 8 sets of the dynamic control signals. The data bit signals DQ1-DQ8 are then transmitted from programmable delay circuits 421-428 to registers 431-438, respectively. Registers 431-438 store the data bit signals DQ1-DQ8 in response to a strobe signal DQS.

The strobe signal DQS is transmitted to pin 409 from an external source as shown in FIG. 4. Input buffer 419 drives the strobe signal DQS from pin 409 to programmable delay circuit 429. Programmable delay circuit 429 delays the strobe signal DQS by an amount of delay that is determined by one set of the dynamic control signals. The delayed strobe signal is transmitted from programmable delay circuit 429 to each of the eight registers 431-438. Registers 431-438 capture and store the data bit signals DQ1-DQ8, respectively, in response to a predefined logic state or logic transition in the strobe signal DQS. In an alternative embodiment, registers 431-438 and programmable delay circuits 421-428 are located inside I/O blocks 411-418, respectively. Programmable delay circuits that are programmed by state machine 410 can, for example, be coupled to or located inside of every I/O block on the integrated circuit. Each I/O block is coupled to a pin of the integrated circuit.

Data bit signals DQ1-DQ8 and strobe signal DQS are transmitted to integrated circuit 400 from an external chip through transmission lines, e.g., on a printed circuit board. Variations may exist in the delays between corresponding parallel bits in data signals DQ1-DQ8. The variations in the delays between corresponding parallel bits in the data signals can be caused, for example, by variations in the lengths of the transmission lines that transmit the data signals, variations in the lengths of bond wires coupled to pins 401-408 in the package, and variations in the process and the temperature of the external chip (e.g., a memory chip).

According to one embodiment, state machine 410 measures the differential delays and/or phase offsets between corresponding parallel signals that are transmitted from an external chip to pins 401-409. Initially, state machine 410 sends training signals through pins 401-409 to the external chip, and receives reply signals through pins 401-409 from the external chip in response to the training signals. State machine 410 then calculates any differences in the delays and/or phases between corresponding parallel bits in the reply signals. The transmission lines, the package, and PVT variations in the external chip can cause differences in the delays and/or phases of corresponding parallel bits. If state machine 410 determines that there are differences between the delays and/or phases of correspond parallel bits in the reply signals received through pins 401-409, state machine 410 adjusts the dynamic control signals to cause delay circuits 421-429 to compensate for these differential delays and/or phases during the user mode of the integrated circuit. The user mode is the normal operation when the data bit signals DQ1-DQ8 are received at pins 401-408 and stored in registers 431-438.

For example, if the transmission lines coupled to pins 401 and 402 have different lengths, these transmission lines cause data bit signals DQ1 and DQ2 to have different delays when received at pins 401 and 402. State machine 410 calculates the differential delays between parallel data bits received through pins 401 and 402 by sending training signals through the pins and analyzing the reply signals sent back. State machine 410 then adjusts the delay of one or both of programmable delay circuits 421-422 by adjusting the dynamic control signals to cause the phases of DQ1 and DQ2 to be aligned appropriately at the output terminals of circuits 421-422. By compensating for differential delays between all of pins 401-408, state machine 410 causes the data bit signals DQ1-DQ8 to have the desired delays and phase relationships at the output terminals of programmable delay circuits 421-428 as indicated by the configuration signals.

As mentioned above, differential delays at pins 401-409 can be caused by the bond wires coupled to those pins having different lengths in the package containing integrated circuit 400. According to one embodiment, the lengths of the bond wires in the package are measured after integrated circuit 400 is manufactured. Configuration bits are generated that indicate any differences in the lengths of the bond wires. The configuration bits are then stored in integrated circuit 400. State machine 410 adjusts the dynamic control signals using these configuration bits to cause programmable delay circuits 421-429 to compensate for the different bond wire lengths, so that the output signals of programmable delay circuits 421-429 do not experience phase offsets as a result of the bond wires in the package.

Figure 5:
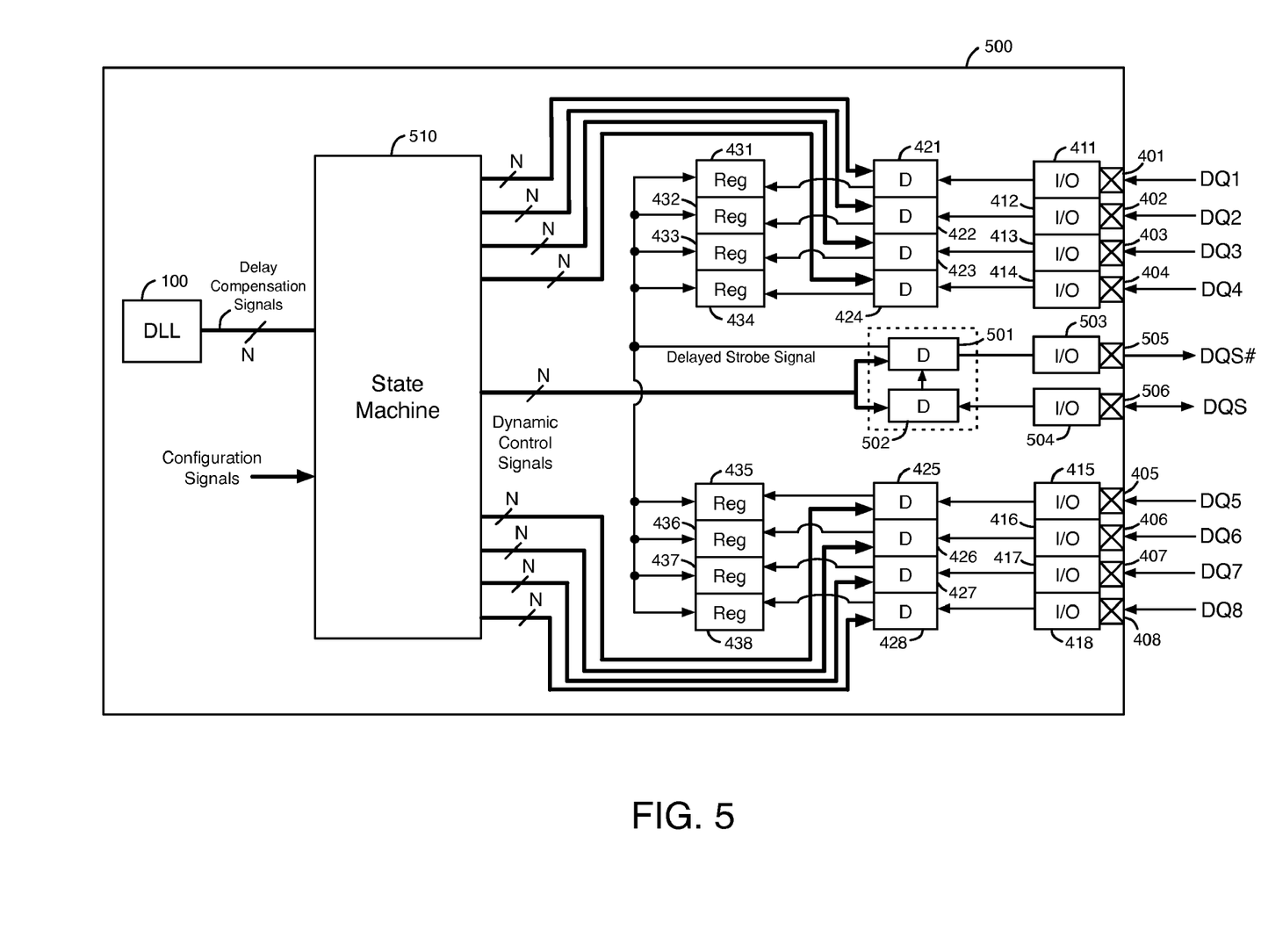
FIG. 5 illustrates a portion of an integrated circuit having programmable delay circuits that can be cascaded together, according to an embodiment of the present invention.

FIG. 5 illustrates a portion of an integrated circuit 500 having programmable delay circuits that can be cascaded together, according to an embodiment of the present invention. Integrated circuit 500 can be, e.g., an ASIC or a programmable logic integrated circuit. Integrated circuit 500 includes DLL 100, state machine 510, input/output (I/O) pins 401-408 and 505-506, input/output (I/O) blocks 411-418 and 503-504, programmable delay circuits 421-428 and 501-502, and registers 431-438.

I/O pins 401-408 and 505-506 are external terminals of the integrated circuit 500. An example of the architecture of DLL 100 in integrated circuit 500 is shown in FIG. 1. An example of the architecture of each of programmable delay circuits 421-428 and 501-502 is shown in FIG. 2B.

DLL 100 in integrated circuit 500 generates an N number of delay compensation signals as described above with respect to FIG. 1. The delay compensation signals are transmitted to a state machine 510. Configuration signals are also transmitted to state machine 510. State machine 510 generates 9 sets of N dynamic control signals in response to the logic states of the delay compensation signals and in response to the logic states of the configuration signals, as described above with respect to previous embodiments. State machine 510 can, for example, be implemented using programmable logic blocks (e.g., logic elements) that are configured by configuration data stored in a programmable logic integrated circuit.

8 of the 9 sets of dynamic control signals are transmitted to programmable delay circuits 421-428. One set of the 9 sets of dynamic control signals is transmitted to programmable delay circuits 501-502. The logic states of the dynamic control signals determine the delays of the corresponding programmable delay circuits 421-428 and 501-502.

Programmable delay circuit 501 can be configured to delay the output signal of programmable delay circuit 502. According to this particular example, programmable delay circuits 501 and 502 are configurable to be cascaded together into one continuous delay chain to delay an input strobe signal DQS that is received at pin 506 from an external memory chip. An input buffer in I/O block 504 drives strobe signal DQS from pin 506 to programmable delay circuit 502. Programmable delay circuits 501-502 delay the strobe signal by delays that are determined by one set of the dynamic control signals generated by state machine 510. The delayed output strobe signal of programmable delay circuit 502 is transmitted to the input terminal of programmable delay circuit 501. The delayed output strobe signal of programmable delay circuit 501 is transmitted to registers 431-438. Registers 431-438 capture the delayed data bit signals DQ1-DQ8 in response to a predefined logic state or logic transition in the delayed strobe signal.

Assuming programmable delay circuit 429 in FIG. 4 and programmable delay circuits 501-502 have the same architecture, programmable delay circuits 501-502 can be cascaded to delay strobe signal DQS by up to twice as much as delay circuit 429. By cascading two programmable delay circuits 501-502 together, two times as many delay circuits 251-258 can be used to delay an input signal. Cascading two or more programmable delay circuits together can be used, for example, to delay low frequency signals by a desired phase shift. Because the period of a low frequency signal is longer than the period of a high frequency signal, more delay is needed to delay the low frequency signal by a desired phase shift, e.g., a 90-degree phase shift.

Each of the programmable delay circuits 501 and 502 is configurable to delay signals that are transmitted from or transmitted to pins of integrated circuit 500. Programmable delay circuit 501 can be coupled to delay input signals transmitted from pin 505 or output signals transmitted to pin 505 through I/O buffer 503. Programmable delay circuit 502 can be coupled to delay input signals transmitted from pin 506 or output signals transmitted to pin 506 through I/O buffer 504. Multiplexers can be used to couple the input and output terminals of programmable delay circuits 501 and 502 to input or output buffers in I/O blocks 503-504.

Cascading programmable delay circuits 501-502 into one delay chain to achieve a longer delay adds flexibility to integrated circuit 500. Adding additional delay circuits within each single programmable delay circuit that is configurable to delay signals transmitted to or from a single I/O pin increases the die area and the complexity of the integrated circuit. Cascading two programmable delay circuits 501-502 that are configurable to delay signals transmitted to or from two separate I/O pins 505 and 506 reduces the die size of the integrated circuit.

Programmable delay circuits 501-502 can also be used to generate a differential output signal. For example, programmable delay circuits 501 and 502 can generate a differential output strobe signal DQS/DQS#. Strobe signal DQS# is the inverse of strobe signal DQS. In this example, an output buffer in I/O block 503 drives the inverted strobe signal DQS# from programmable delay circuit 501 to pin 505, and an output buffer in I/O block 504 drives the strobe signal DQS from programmable delay circuit 502 to pin 506.

Figure 6:
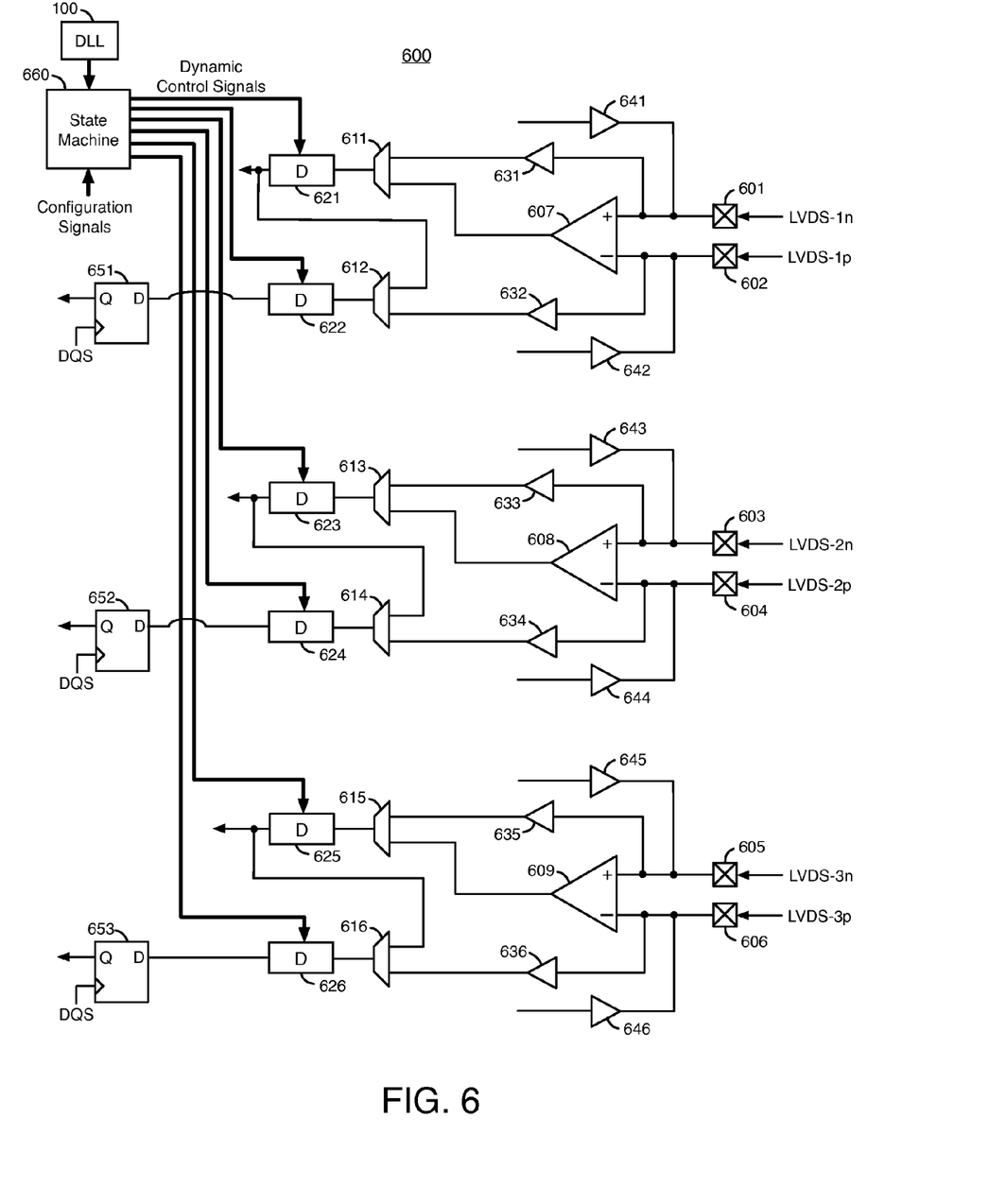
FIG. 6 illustrates a portion of an integrated circuit having multiple sets of programmable delay circuits that can be cascaded together, according to an embodiment of the present invention.

FIG. 6 illustrates a portion of an integrated circuit 600 having multiple sets of programmable delay circuits that can be cascaded together, according to an embodiment of the present invention. Integrated circuit 600 can be, e.g., an ASIC or a programmable logic integrated circuit. Integrated circuit 600 includes DLL 100, state machine 660, input/output (I/O) pins 601-606, differential input buffers 607-609, single-ended input buffers 631-636, single-ended output buffers 641-646, multiplexers 611-616, programmable delay circuits 621-626, and registers 651-653.

I/O pins 601-606 are external terminals of integrated circuit 600. An example of the architecture of DLL 100 in integrated circuit 600 is shown in FIG. 1. An example of the architecture of each of programmable delay circuits 621-626 is shown in FIG. 2B.

Differential input buffers 607-609, single-ended input buffers 631-636, single-ended output buffers 641-646, multiplexers 611-616, programmable delay circuits 621-626, and registers 651-653 can, for example, be part of I/O blocks. In other embodiments, the I/O blocks include differential output buffers that have differential output terminals coupled to two pins.

Differential input buffer 607 is a receiver that drives a first low voltage differential signaling (LVDS) input signal LVDS-1n/LVDS-1p from pins 601-602 to multiplexer 611 as a single-ended LVDS signal. Multiplexer 611 is configurable to transmit the LVDS output signal of input buffer 607 to the input terminal of programmable delay circuit 621. Programmable delay circuit 621 delays the LVDS signal. The output terminal of programmable delay circuit 621 is coupled to an input terminal of multiplexer 612. Multiplexer 612 is configurable to transmit the delayed LVDS output signal of programmable delay circuit 621 to the input terminal of programmable delay circuit 622 so that programmable delay circuits 621-622 are cascaded together into one delay chain. When two programmable delay circuits are cascaded together, the 16 delay circuits 251-258 in the two programmable delay circuits are coupled together in series. Programmable delay circuit 622 delays the LVDS signal. The delayed LVDS output signal of programmable delay circuit 622 is transmitted to register 651. Register 651 stores the LVDS output signal of programmable delay circuit 622 at its Q output terminal in response to the strobe signal DQS.

For example, if each of programmable delay circuits 621-622 can separately generate a maximum delay of 2.4 ns, programmable delay circuits 621-622 can be cascaded together to generate a total delay of 4.8 ns. According to a specific embodiment, programmable delay circuits 621-622 can generate a phase shift of + or −1 bit period by cascading programmable delay circuits 621-622 together with PVT compensation from DLL 100. This embodiment allows low-speed data and clock recovery using an external voltage-controlled oscillator.

Differential input buffer 608 is another receiver that drives a second low voltage differential signaling (LVDS) input signal LVDS-2n/LVDS-2p from pins 603-604 to multiplexer 613 as a single-ended LVDS signal. Multiplexer 613 is configurable to transmit the LVDS output signal of input buffer 608 to the input terminal of programmable delay circuit 623. Programmable delay circuit 623 delays the LVDS signal. The output terminal of programmable delay circuit 623 is coupled to an input terminal of multiplexer 614. Multiplexer 614 is configurable to transmit the delayed LVDS output signal of programmable delay circuit 623 to the input terminal of programmable delay circuit 624 so that programmable delay circuits 623-624 are cascaded together into one delay chain. Programmable delay circuit 624 delays the LVDS signal. The delayed LVDS output signal of programmable delay circuit 624 is transmitted to register 652. Register 652 stores the delayed LVDS output signal of programmable delay circuit 624 at its Q output terminal in response to the strobe signal DQS.

Differential input buffer 609 is another receiver that drives a third low voltage differential signaling (LVDS) input signal LVDS-3n/LVDS-3p from pins 605-606 to multiplexer 615 as a single-ended LVDS signal. Multiplexer 615 is configurable to transmit the LVDS output signal of input buffer 609 to the input terminal of programmable delay circuit 625. Programmable delay circuit 625 delays the LVDS signal. The output terminal of programmable delay circuit 625 is coupled to an input terminal of multiplexer 616. Multiplexer 616 is configurable to transmit the delayed LVDS output signal of programmable delay circuit 625 to the input terminal of programmable delay circuit 626 so that programmable delay circuits 625-626 are cascaded together into one delay chain. Programmable delay circuit 626 delays the LVDS signal. The delayed LVDS output signal of programmable delay circuit 626 is transmitted to register 653. Register 653 stores the delayed LVDS output signal of programmable delay circuit 626 at its Q output terminal in response to the strobe signal DQS.

State machine 660 generates 6 separate sets of dynamic control signals that are transmitted to programmable delay circuits 621-626. The delay provided by each of the programmable delay circuits 621-626 is determined by one set of the dynamic control signals. Each set of the dynamic control signals includes multiple signals. State machine 660 controls the delays of programmable delay circuits 621-626 on an individual basis. State machine 660 can cause two or more of the programmable delay circuits 621-626 to have different delays. For example, the delay of circuit 621 can be different than the delay of circuit 622.

State machine 660 selects the delays of programmable delay circuits 621-626 based on the logic states of the configuration signals. State machine 660 adjusts the delays of programmable delay circuits 621-626 in response to changes in the delay compensation signals that are caused, e.g., by process, supply voltage, and temperature (PVT) variations in integrated circuit 600. State machine 660 can, for example, be implemented using programmable logic blocks (e.g., logic elements) that are configured by configuration data stored in a programmable logic integrated circuit.

If the transmission lines that transmit the 3 LVDS signals to pins 601-606 have different lengths, corresponding bits in the LVDS signals may not be aligned. Other factors, such as package bond wire delays, can also cause corresponding LVDS bits to be misaligned. When corresponding LVDS bits are not aligned, registers 651-653 do not capture the corresponding LVDS bits at the same, and registers 651-653 generate erroneous output signals.

According to one embodiment, state machine 660 measures the differential delays between differential signals that are transmitted from an external chip through the transmission lines to pins 601-606. Initially, state machine 660 sends LVDS training signals to the external chip through pins 601-606. State machine 660 receives LVDS reply signals from the external chip in response to the training signals through pins 601-606. State machine 660 then calculates any differences in the delays between corresponding LVDS bits in the reply signals. For example, bits in the LVDS-1$n$/LVDS-1$p$ signals may have a phase offset relative to corresponding bits in the LVDS-2$n$/LVDS-2$p$ signals and corresponding bits in the LVDS-3$n$/LVDS-3$p$ signals.

If state machine 660 determines that there are differences between the delays and/or phases of two or more corresponding bits in the LVDS reply signals received through pins 601-606, state machine 660 adjusts the dynamic control signals to cause delay circuits 621-626 to compensate for these differential delays and/or phases during the user mode of circuit 600. As a result, the delayed LVDS output signals of registers 651-653 are bit aligned. Word alignment can be performed using additional circuitry (not shown) that processes the output signals of registers 651-653.

Programmable delay circuits 621-626 are configurable to each delay a separate signal transmitted through a separate one of the I/O pins 601-606. For example, multiplexers 611-616 can be configured to transmit the output signals of single-ended input buffers 631-636 to the input terminals of programmable delay circuits 621-626, respectively. Programmable delay circuits 621-626 delay the single-ended input signals driven by input buffers 631-636 from pins 601-606, respectively, in this example. Thus, programmable delay circuits 621/622, 623/624, and 625/626 are configurable so that they are not cascaded together, but instead delay 6 separate input signals driven from 6 separate pins.

In yet another embodiment, output buffers 641-646 transmit 6 single-ended output signals to pins 601-606. In this embodiment, programmable delay circuits 621-626 are not used.

Figure 7:
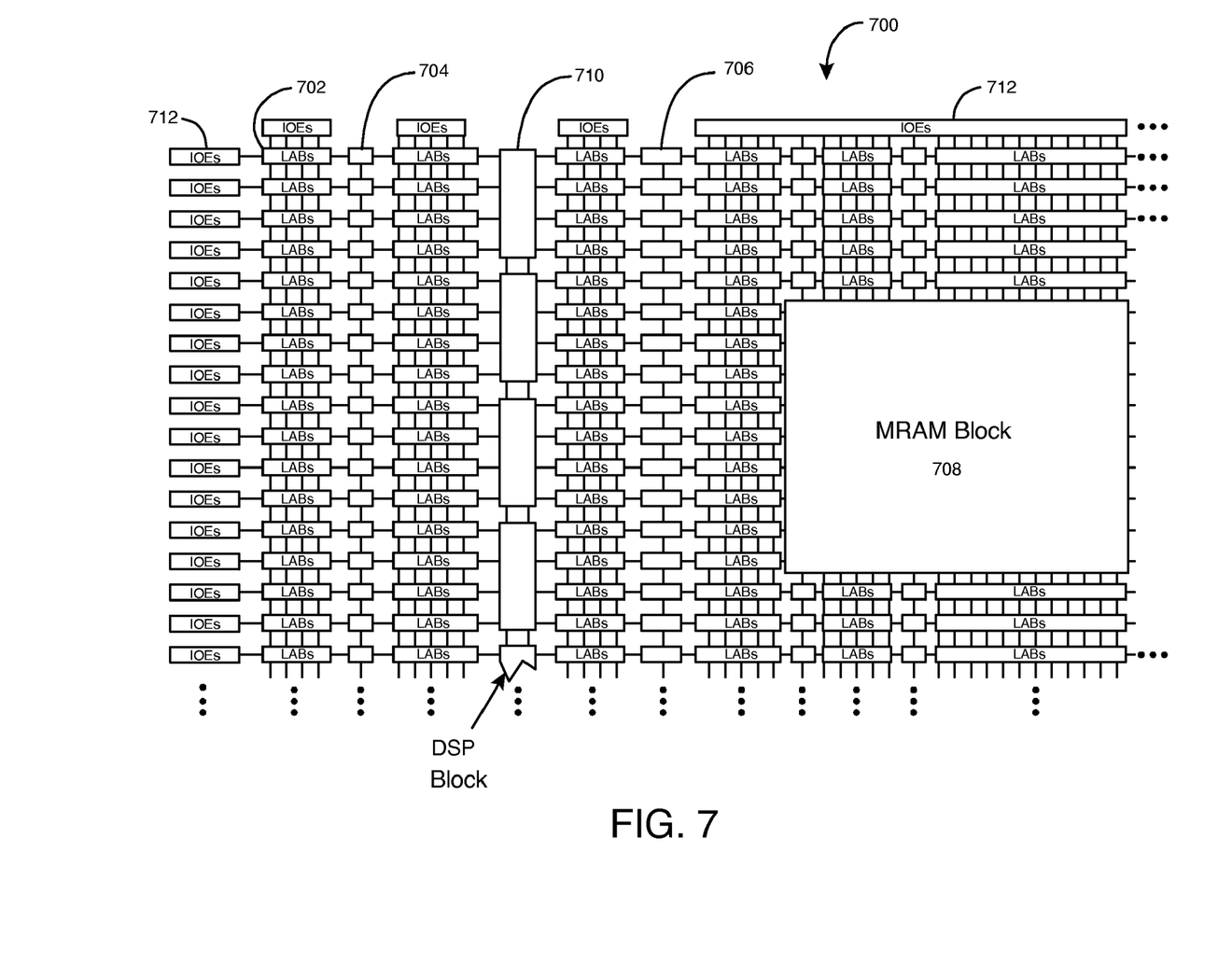
FIG. 7 illustrates a simplified partial block diagram of a field programmable gate array (FPGA) that can include aspects of the present invention.

FIG. 7 is a simplified partial block diagram of a field programmable gate array (FPGA) 700 that can include aspects of the present invention. FPGA 700 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic block that provides for efficient implementation of user defined logic functions. A FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including random access memory (RAM) blocks of varying sizes provided throughout the array. The RAM blocks include, for example, blocks 704, blocks 706, and block 708. These memory blocks can also include shift registers and FIFO buffers.

FPGA 700 further includes digital signal processing (DSP) blocks 710 that can implement, for example, multipliers with add or subtract features. Input/output elements (IOEs) 712 located, in this example, around the periphery of the chip support numerous single-ended and differential input/output standards. Each IOE 712 is coupled to an external terminal (i.e., a pin) of FPGA 700. It is to be understood that FPGA 700 is described herein for illustrative purposes only and that the present invention can be implemented in many different types of PLDs, FPGAs, and ASICs.

Figure 8:
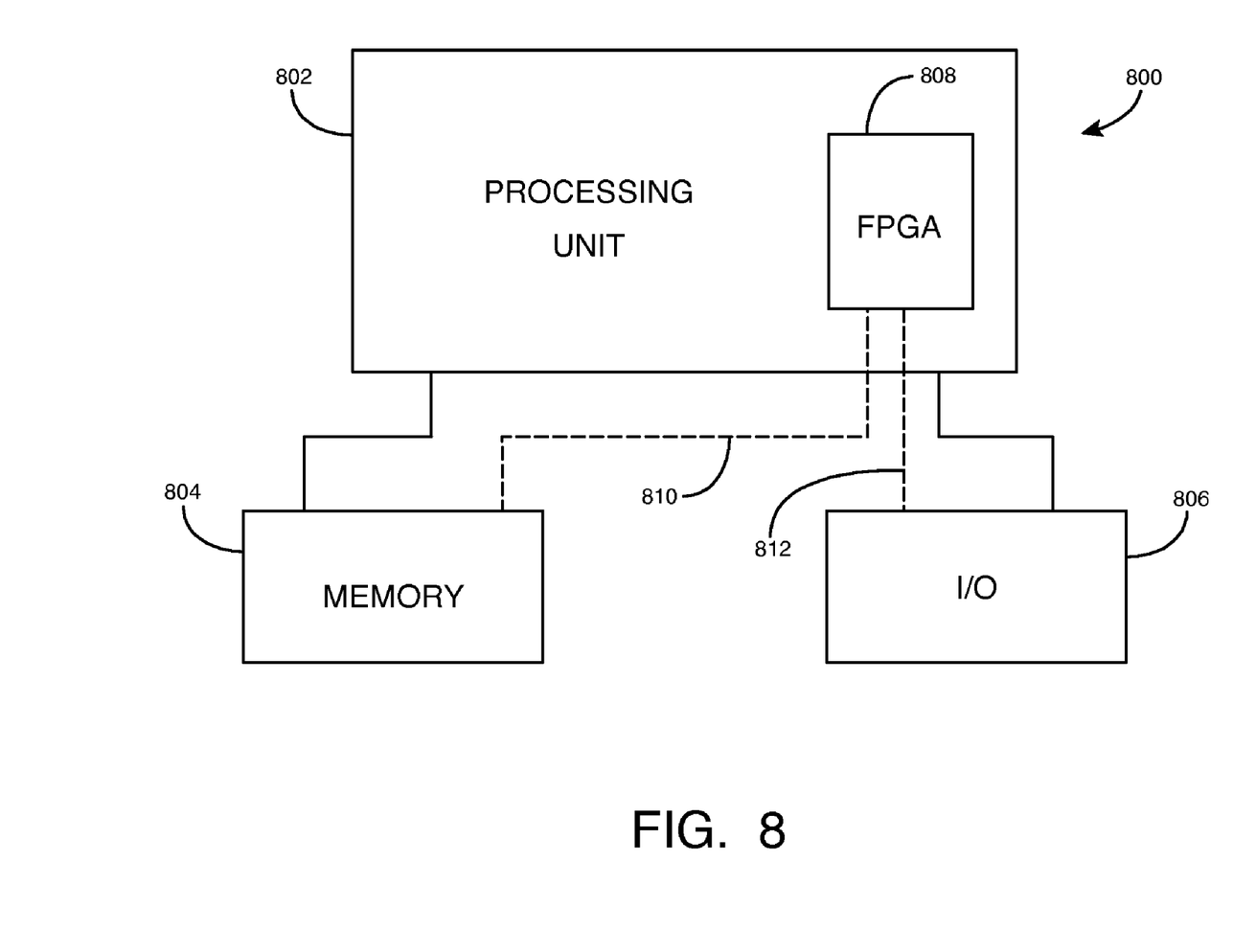
FIG. 8 illustrates a block diagram of an exemplary digital system that can embody techniques of the present invention.

The present invention can also be implemented in a system that has a FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804, and an input/output (I/O) unit 806 interconnected together by one or more buses. According to this exemplary embodiment, FPGA 808 is embedded in processing unit 802. FPGA 808 can serve many different purposes within the system in FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804, receive and transmit data via I/O unit 806, or other similar function. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor that can be reprogrammed as needed to handle a particular computing task. Alternately, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
 a sensing circuit generating delay compensation signals that change in response to variations in at least one of a process and a temperature of the circuit;
 a first control circuit generating dynamic control signals based on delay select signals; and
 a first programmable delay circuit configurable to delay a signal by a first delay that is selected by the dynamic control signals, wherein the first control circuit adjusts the dynamic control signals in response to the delay compensation signals without being responsive to a signal delayed by the first programmable delay circuit to compensate for effects of the variations in at least one of the process and the temperature of the circuit on the first delay so that the first delay more closely matches a delay indicated by the delay select signals.

2. The circuit defined in claim 1 further comprising:
 a second programmable delay circuit configurable to be cascaded with the first programmable delay circuit such that the first programmable delay circuit delays a signal by the first delay to generate a delayed signal, and the second programmable delay circuit delays the delayed signal by a second delay, the second delay being selected by the dynamic control signals,
 wherein the second programmable delay circuit is configurable to delay a signal transmitted through an external terminal of the circuit.

3. The circuit defined in claim 1 further comprising:
 a second programmable delay circuit configurable to delay a signal transmitted through an external terminal of the circuit by a second delay that is selected by the dynamic control signals, wherein the first control circuit controls the first and the second delays individually on a per pin basis.

4. The circuit defined in claim 1 wherein the first programmable delay circuit is configurable to delay a signal by the first delay that is selected by a first subset of the dynamic control signals, and wherein the circuit further comprises:
 a second programmable delay circuit configurable to delay a signal by a second delay that is selected by a second subset of the dynamic control signals,
 wherein the first control circuit generates the first subset of the dynamic control signals based on a first subset of the delay select signals, and the first control circuit generates the second subset of the dynamic control signals based on a second subset of the delay select signals.

5. A circuit comprising:
 a sensing circuit generating delay compensation signals that change in response to variations in at least one of a process and a temperature of the circuit;
 a first control circuit generating dynamic control signals in response to the delay compensation signals; and
 a first programmable delay circuit configurable to delay a signal transmitted through an external terminal of the circuit by a first delay that is selected by the dynamic control signals, wherein the first programmable delay circuit is configurable to delay a strobe signal transmitted from the external terminal by the first delay to generate a delayed strobe signal, the delayed strobe signal being transmitted to registers in the circuit that capture input data signals in response to the delayed strobe signal.

6. The circuit defined in claim 1 wherein the sensing circuit comprises:
 first delay circuits;
 a phase detector;
 a second control circuit generating the delay compensation signals in response to a phase error signal from the phase detector; and
 a multiplexer that transmits an output signal of one of the first delay circuits to the phase detector in response to the delay compensation signals.

7. The circuit defined in claim 6 wherein the first programmable delay circuit comprises second delay circuits, each of the second delay circuits has the same delay, and delays of the first and the second delay circuits are affected by the process and the temperature variations of the circuit.

8. The circuit defined in claim 1 further comprising:
 an input block comprising an input buffer, wherein an input data signal is driven to the first programmable delay circuit by the input buffer from an external terminal of the circuit, and the first programmable delay circuit is configurable to delay the input data signal by the first delay.

9. The circuit defined in claim 6 wherein the first programmable delay circuit comprises second delay circuits, each of the second delay circuits has the same architecture as each of the first delay circuits, and the sensing circuit varies the delay compensation signals in response to variations in the process and the temperature of the circuit.

10. The circuit defined in claim 1 wherein the first control circuit is a state machine that generates the dynamic control signals based on the delay select signals, and the state machine adjusts the dynamic control signals to vary the first delay of the first programmable delay circuit in response to changes in the delay compensation signals that are caused by the process and the temperature variations of the circuit.

11. The circuit defined in claim 1 wherein the circuit is a programmable logic integrated circuit, and the first control circuit is a state machine that is implemented in programmable logic blocks.

12. A circuit comprising:
 a first control circuit generating dynamic control signals based on delay select signals;
 a first programmable delay circuit configurable to delay a signal by a first delay selected by the dynamic control signals; and
 a second programmable delay circuit configurable to delay a signal by a second delay selected by the dynamic control signals,
 wherein the first and the second programmable delay circuits are configurable to be cascaded together such that the second programmable delay circuit delays a signal delayed by the first programmable delay circuit, and
 wherein the first control circuit adjusts the dynamic control signals without being responsive to signals delayed by the first and the second programmable delay circuits to compensate for effects of variations in at least one of a process and a temperature of the circuit on the first and the second delays so that the first and the second delays more closely match delays indicated by the delay select signals.

13. The circuit defined in claim 12 further comprising:
 a sensing circuit generating delay compensation signals and adjusting the delay compensation signals in response to variations in the process and the temperature of the circuit, wherein the first control circuit is a first state machine that varies the dynamic controls signals in response to the delay compensation signals to provide process and temperature adjustments to the first and the second delays.

14. The circuit defined in claim 13 wherein the sensing circuit comprises;
  first delay circuits;
  a phase detector;
  a second state machine generating the delay compensation signals in response to a phase error signal from the phase detector; and
  a multiplexer that transmits an output signal of one of the first delay circuits to the phase detector in response to the delay compensation signals.

15. The circuit defined in claim 14 wherein the first programmable delay circuit comprises second delay circuits, the second programmable delay circuit comprises third delay circuits, and each of the first, the second, and the third delay circuits have the same architecture.

16. The circuit defined in claim 12
  wherein the first control circuit adjusts the dynamic control signals so that the signals delayed by the first and the second programmable delay circuits are bit aligned.

17. The circuit defined in claim 12 further comprising:
  a third programmable delay circuit configurable to delay a signal by a third delay selected by the dynamic control signals,
  wherein the first control circuit adjusts the dynamic control signals to compensate for effects of the variations in at least one of the process and the temperature of the circuit on the third delay so that the third delay more closely matches a delay indicated by the delay select signals.

18. A method for delaying a signal on a circuit, the method comprising:
  generating delay compensation signals that change in response to variations in a process and a temperature of the circuit;
  generating dynamic control signals based on delay select signals;
  delaying a signal by a first delay that is selected by the dynamic control signals; and
  adjusting the dynamic control signals in response to the delay compensation signals without being responsive to a signal delayed by the first delay to compensate for effects of the variations in the process and the temperature of the circuit on the first delay so that the first delay more closely matches a delay indicated by the delay select signals.

19. The method defined in claim 18 further comprising:
  cascading together first and second programmable delay circuits such that the second programmable delay circuit delays a signal delayed by the first programmable delay circuit, wherein the first programmable delay circuit has the first delay, wherein the second programmable delay circuit has a second delay that is selected by the dynamic control signals, and wherein the second programmable delay circuit is configurable to delay a signal transmitted through a pin of the circuit.

20. The method defined in claim 19 wherein generating the delay compensation signals that change in response to variations in the process and the temperature of the circuit further comprises delaying an input clock signal using first delay circuits, selecting an output signal of one of the first delay circuits using a multiplexer, comparing a phase of the input clock signal to an output signal of the multiplexer to generate a phase error signal, and generating the delay compensation signals using a state machine in response to the phase error signal, wherein the delay compensation signals are transmitted to select inputs of the multiplexer.

21. The method defined in claim 20 wherein the first programmable delay circuit delays a signal by the first delay using second delay circuits, and each of the second delay circuits has the same architecture as each of the first delay circuits.

22. The method defined in claim 19 wherein generating the dynamic control signals based on delay select signals further comprises selecting the first delay using a first subset of the dynamic control signals in response to first delay select signals, and selecting the second delay using a second subset of the dynamic control signals in response to second delay select signals.

23. A circuit comprising:
  a sensing circuit generating delay compensation signals;
  a first control circuit generating dynamic control signals based on delay select signals; and
  a first delay circuit delaying a signal by a first delay that is selected by the dynamic control signals, wherein to compensate for effects of variations in at least one of a process and a temperature of the circuit on the first delay, the first control circuit purposefully adjusts the dynamic control signals solely in response to the delay compensation signals, whereby the first delay more closely matches a delay indicated by the delay select signals.

* * * * *